United States Patent [19]
Goodwin

[11] Patent Number: 5,300,777
[45] Date of Patent: Apr. 5, 1994

[54] TWO COLOR INFRARED DETECTOR AND METHOD

[75] Inventor: Michael W. Goodwin, Richardson, Tex.

[73] Assignee: Texas Instruments Incorporated, Dallas, Tex.

[21] Appl. No.: 860,733

[22] Filed: Mar. 26, 1992

[51] Int. Cl.$^5$ .............. H01L 31/0296; H01L 31/0248
[52] U.S. Cl. ............................ 250/338.4; 250/339.01; 250/370.06; 250/370.13; 257/442; 257/188
[58] Field of Search .................... 250/370.06, 370.13, 250/339, 338.4; 257/442, 614, 773, 758, 184, 188

[56] References Cited

U.S. PATENT DOCUMENTS

| | | | |
|---|---|---|---|
| 3,962,578 | 6/1976 | Roschen | 250/370.06 |
| 4,085,500 | 4/1978 | Hager et al. | 257/614 |
| 4,411,732 | 10/1983 | Wotherspoon | 257/442 |
| 4,614,957 | 9/1986 | Arch et al. | 257/188 |
| 4,639,756 | 1/1987 | Rosbeck et al. | 257/442 |
| 4,948,976 | 8/1990 | Baliga et al. | 250/370.06 |
| 4,965,649 | 10/1990 | Zanio et al. | 257/442 |
| 5,113,076 | 5/1992 | Schulte | 250/370.06 |
| 5,144,138 | 9/1992 | Kinch et al. | 250/370.13 |
| 5,188,970 | 2/1993 | York | 257/442 |

FOREIGN PATENT DOCUMENTS 0090669 10/1987 European Pat. Off. ...... H01L 31/08

OTHER PUBLICATIONS

Blazejewski, E. R., "Bias Switchable Dual-Band HgCdTe IR Photodetector" printed at IRIS Detected Specialty Meeting, Boulder, Colo. Aug. 1991.
Casselman et al. "An Integrated Multispectral IR Detection Structure", Extended Abstract US Workshop on the Physics & Chemistry of HgCdTe and Novel IR Detection Materials Oct. 1991.

Primary Examiner—Carolyn E. Fields
Assistant Examiner—Drew A. Dunn
Attorney, Agent, or Firm—Richard A. Stoltz; James C. Kesterson; Richard L. Donaldson

[57] ABSTRACT

A two color infrared detector (10) is described comprising a heterojunction diode and a metal insulator semiconductor ("MIS") device. The diode comprises first (12) and second (14) semiconductor regions which are operable to generate electron-hole pairs when struck by infrared radiation having first and second wavelengths respectively. The gate (24) of the MIS device is operable to generate a potential well in the first semiconductor region conjunction with an insulator layer (22).

14 Claims, 1 Drawing Sheet

TWO COLOR INFRARED DETECTOR AND METHOD

TECHNICAL FIELD OF THE INVENTION

This invention relates in general to semiconductor devices and more particularly to a two color infrared detector and method.

BACKGROUND OF THE INVENTION

Infrared detectors sense electromagnetic radiation having a wavelength, generally, between 0.5 and 15 µm (or having an energy of 2 to 0.1 eV). Infrared detectors are used for a variety of purposes including target acquisition and tracking.

Infrared detectors have been incorporated into integrated circuits for mass production and miniaturization. Typically, they are fabricated in N×M arrays. Each element in the array is itself fabricated with a piece of semiconductor consisting of mercury, cadmium, and tellurium ("HgCdTe") which is operable to generate electron-hole pairs when struck by infrared radiation. The particular wavelength from which each element generates electron-hole pairs may be tuned by adjusting the ratio of mercury to cadmium in the semiconductor material.

In certain applications, it is desirable to be able to detect two distinct wavelengths of infrared radiation. The ratio of two different wavelengths of infrared radiation may be used by a targeting computer for target recognition and target distance calculations. Heretofore, two color infrared detectors have been manufactured using one of two device types. The first device type is a triple-layer-heterojunction diode. This structure employs two back-to-back diodes forming a three terminal semiconductor device. The second type of device is an N×M array consisting of twice the usual number of individual detector elements. Half of the elements are tuned to a first frequency while the second half are tuned to a second frequency. Both of these solutions have numerous disadvantages.

The triple-layer-heterojunction diode consists of two infrared sensitive N-type layers separated by a center P-type layer which is insensitive to infrared radiation. The three layers are aligned along a vertical axis which is generally parallel to the direction of propagation of the incident infrared radiation. A voltage is applied between the first and second and second and third layers such that each diode is reverse biased, either sequentially or simultaneously. If each N-type layer is tuned to a separate infrared wavelength, the detector can detect two infrared wavelengths. Unfortunately this structure requires the center P-type layer and its related interconnect structure. Also, this structure requires two separate sensing circuits to sense two distinct wavelengths. In the alternate, the device could use one sensing circuit and a multiplexer to alternately connect each N-type layer to the sensing circuit.

The second type of two color infrared detector simply uses twice as many elements to sense twice as many events. These elements are laid out in the same horizontal plane which is perpendicular to the axis of incident infrared radiation. This format requires geometrically more space which is oftentimes critical. In addition, this system is not a true two color detector since each set of array elements are not aligned along the same optical axis.

Therefore, a need has arisen for a two color infrared detector which is able to simultaneously detect two wavelengths of infrared light, which is compact, and which minimizes the complexity of the related sensing circuitry.

SUMMARY OF THE INVENTION

In accordance with the present invention, a two color infrared detector is provided which substantially eliminates or reduces disadvantages and problems associated with prior infrared detectors.

A two color infrared detector is described comprising a heterojunction diode and a metal insulator semiconductor ("MIS") device. The diode comprises first and second semiconductor regions which are operable to generate electron-hole pairs when struck by infrared radiation having first and second wavelengths respectively. The gate of the MIS device is operable to generate a potential well in the first semiconductor region in conjunction with an insulator layer.

The first technical advantage of the disclosed detector is its ability to detect infrared radiation of two wavelengths simultaneously. This allows a programmer to calculate various quantities related to the spectral distribution of a target.

The second technical advantage of the device is its requirement for a single set of sensing circuitry. This reduces system costs, complexity, and size.

A third technical advantage of the disclosed invention is its need for a single voltage source. Only one voltage bias source is required for operation. This reduces system costs, complexity, and size.

A fourth technical advantage of the disclosed invention is its exclusive use of known fabrication methods. No new technologies are required for the implementation of the device. This increases the reliability of the system.

A final technical advantage of the disclosed invention is the vertical integration of the system along the axis of incident infrared radiation. This improves the accuracy of any calculation which assumes a single source of the two wavelengths of light.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
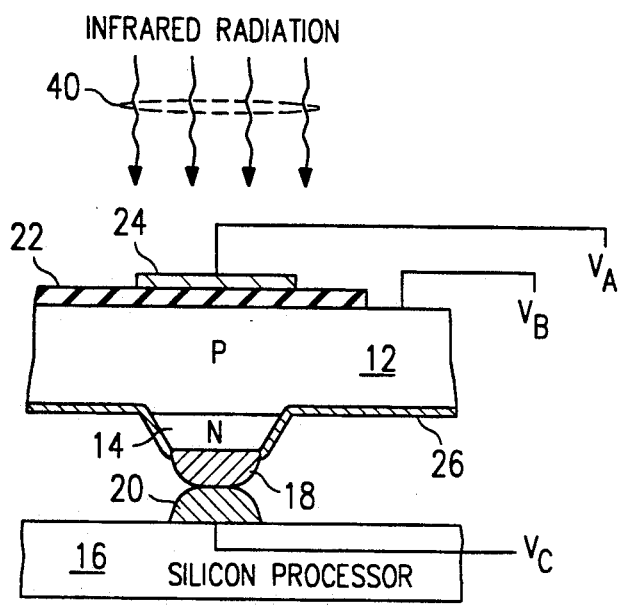
FIG. 1 depicts a cross-sectional view of the disclosed two color infrared detector.
Figure 2A:
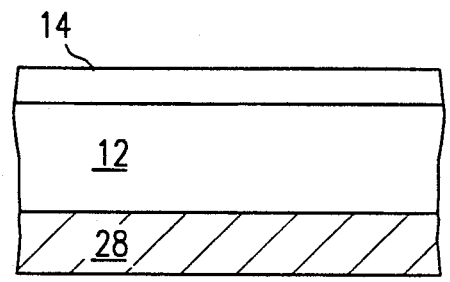
FIGS. 2a, 2b, 2c, 2d and 2e depict sequential cross-sectional views during manufacture of the two color infrared detector depicted in FIG. 1.
Figure 2B:
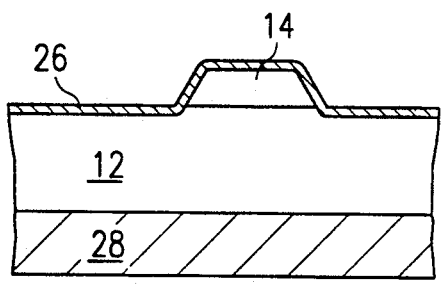
Figure 2C:
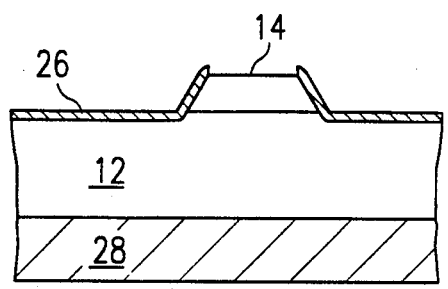
Figure 2D:
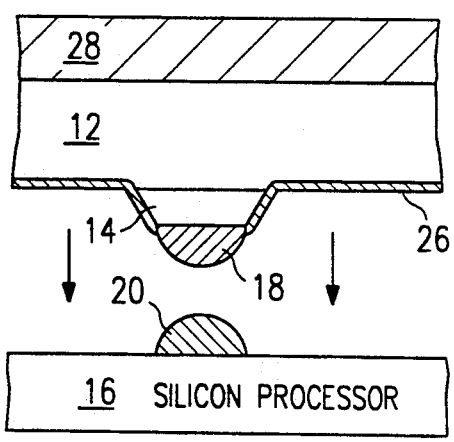
Figure 2E:
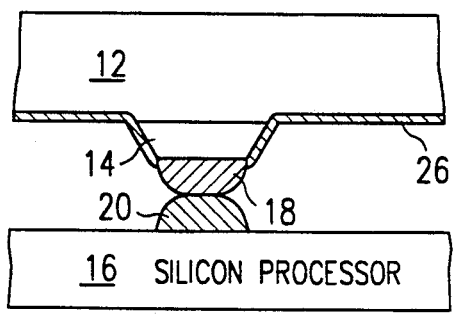

The preferred embodiment of the present invention and its advantages are best understood by referring to FIGS. 1 through 2e of the drawings, like numerals being used for like and corresponding parts of the various drawings.

FIG. 1 depicts a cross-sectional view of the disclosed two color infrared detector 10. Detector 10 is a heterostructure device comprising a metal insulator semiconductor ("MIS") device on top of a heterojunction diode. The heterojunction diode (each region has a different bandgap) consists of a wide-bandgap P-type HgCdTe layer 12 on top of a narrow-bandgap N-type HgCdTe layer 14. Narrow-bandgap 14 is indium bump bonded to a silicon processor layer 16 through indium bumps 18 and 20. As will be explained later, silicon processor layer 16 includes sensing circuitry to sense respective charges associated with wide band gap layer 12 and narrow band gap layer 14. The MIS structure comprises an insulator layer 22 and a metal gate 24. This MIS device uses the wide-bandgap side of the heterojunction diode to form a wide-bandgap infrared detector. Detector 10 also comprises a passivation layer 26 on layers 12 and 14 as depicted. A contact, $V_B$, to layer 12 is provided in addition to contacts $V_A$ and $V_C$ to metal gate 24 and bump 20. As depicted, layers 12 and 14 are aligned along an axis which is generally parallel to the axis of incident radiation. If detector size is not critical, layers 12 and 14 can be arranged in other, less efficient, geometries.

In operation, the diode is reverse biased with respect to the P-type layer 12 and the MIS device is pulsed to deep depletion with respect to layer 12. For instance, $V_A=5$ V, $V_B=0$ V, and $V_C=0.5$ V. Infrared radiation enters from the top, passing through the MIS device. In FIG. 1 arrows 40 show the direction of incident infrared radiation with respect to metal gate 24. The MIS device is fabricated such that it is optically transparent to the wavelengths of interest. The wide-bandgap part of the spectrum is absorbed in the first few microns (1/absorption length) of layer 12. Electron-hole pairs are generated and the electrons diffuse to the MIS device where they fill the potential well caused by the voltage on $V_A$. The narrow-bandgap radiation component of the incident infrared radiation travels through the wide-bandgap layer to the narrow-bandgap side of the heterojunction diode where it is absorbed. Electron-hole pairs are generated and the holes then diffuse to the heterojunction and out through the P-type base and Vs This may be represented as a change in charge on a capacitor (not shown) that is connected to the N-type side of the heterojunction diode in silicon processor layer 16. Thus, the HgCdTe MIS device integrates charge created by the wide-bandgap part of the spectrum and the capacitor simultaneously integrates charge (through the HgCdTe heterojunction diode) associated with the narrow-bandgap part of the spectrum time.

After a set integration time period (100-200 μsec), the created charge is sensed by silicon processor layer 16. The charge on the capacitor (charge from layer 14) is sensed first and the capacitor is immediately reset by setting $V_C=0$ V to integrate charge from the MIS device. The diode is again reverse biased with respect to layer 14, $V_B=0$ and $V_C=0.5$ V, and the MIS device is reset, $V_A=0$ V. This allows the integrated wide-bandgap photogenerated charge (electrons) in layer 12 to migrate through the heterojunction diode and on to the capacitor in silicon processor layer 16. The charge can then be sensed in the same manner as with the previous narrow-bandgap charge. Although integration of charge due to the two parts of the spectrum occurs at the same time, the charge is sensed sequentially.

In array form, all of the MIS devices could be bused together to a common voltage source. There is no need to address the MIS devices through a row-column addressing scheme because the charge is read through the HgCdTe diode to the silicon processor layer and not through gate 24. All of the HgCdTe diodes other than the pixel of interest can be used as guard diodes to bleed away unwanted charge.

The thickness of the two HgCdTe layers is determined by their respective minority carrier diffusion and bandgap absorption lengths. For 5 μm bandgap P-type HgCdTe, the absorption length is a few microns (<5 μm) and the minority carrier diffusion length is 5 to 10 mils. The P-type wide-bandgap layer must be thin enough to insure that the injected charge from the MIS device will diffuse to the heterojunction diode, yet thick enough that most of the photo-generated charge will diffuse to the MIS device during integration and not to the diode. This means that the wide-bandgap layer should be greater than 10 μm and less than 10 mils. For the narrow-bandgap N-type layer, the thickness should be less than a minority carrier diffusion length (1-2 mils), but greater than an absorption length (for 10 μm bandgap HgCdTe, the absorption length is 5-10 μm). Thus, the narrow-bandgap layer should be 5 to 25 μm.

FIGS. 2a through 2e depict sequential cross-sectional views during manufacture of the two color infrared detector depicted in FIG. 1.

In FIG. 2a, wide-bandgap P-type HgCdTe layer 12 is grown on either a CdTe or CdZnTe substrate 28 using liquid-phase-epitaxy growth methods ("LPE"). As described in connection with FIG. 1, layer 12 is between 10 and 250 μm thick. In the illustrated embodiment, layer 12 is designed to generate electron-hole pairs when struck by infrared radiation having a wavelength between 3 and 5 μm. In the chemical formula $Hg_{1-x}Cd_xTe$, x therefore ranges from 0.3 to 0.40 for such a sensitivity range. In addition, layer 12 is doped with a suitable dopant such as Arsenic so that layer 12 has a carrier concentration no higher than a few $10^{15}$ cm$^{-3}$.

Narrow-bandgap N-type HgCdTe layer 14 is grown on top of layer 12 using the same LPE methods. As described in connection with FIG. 1, layer 14 is between 5 and 10 μm thick. In the illustrated embodiment, layer 14 is designed to generate election-hole pairs when struck by infrared radiation having a wavelength between 8 and 14 μm. In the chemical formula $Hg_{1-x}Cd_xTe$, x therefore ranges from 0.2 to 0.25 for such a sensitivity range. In addition, layer 14 is doped with a suitable dopant such as Indium so that layer 14 has a carrier concentration up to a few $10^{16}$ cm$^{-3}$.

In FIG. 2b, layers 12 and 14 are etched by, for instance, a mixture of bromine and methanol to form a "mesa" using standard photolithographic techniques. The exposed surfaces of layers 12 and 14, and the sidewalls of the mesa are passivated to ensure the operational reliability of the detector. A passivation layer 26 may be formed by annealing the surface in a furnace and depositing thereon a thin, 1 mil, layer of ZnS or CdTe.

In FIG. 2c, a via is etched through the passivation layer to expose the top of the mesa using a mixture of bromine and methanol.

In FIG. 2d, indium bump 18 is formed on top of the mesa using standard photolithographic techniques. Bump 18 is generally from 10 to 12 μm thick. The resulting structure is then mated to silicon processor layer 16. Silicon processor layer 16 comprises a set of indium bumps 20 which correspond to indium bumps 18 already formed on layer 14. Because indium is a soft malleable metal, these two are compressed together. Alternately, epoxy may be injected between layers 26 and 16 to ensure a more secure union.

In FIG. 2e, substrate 28 is removed from the detector with, for instance, a second bromine methanol etch or a diamond point turning process. Approximately 1600 A of ZnS is then deposited on the exposed surface of layer 12 to form the insulator of the MIS structure. Finally, 50 to 80 A of a transparent metal such as nickel is deposited, patterned, and etched according to standard photolithographic techniques to form gate 24. The finished detector is depicted in FIG. 1.

Although the present invention and its advantages have been described in detail, it should be understood that various changes, substitutions and alterations can be made herein without departing from the spirit and scope of the invention as defined by the appended claims.

What is claimed is:

1. A two color infrared detector comprising:
   a diode having first and second semiconductor regions, the first semiconductor region of P-material operable to generate electron-hole pairs when struck by infrared radiation having a first wavelength and the second semiconductor region of N-material operable to generate electron-hole pairs when struck by infrared radiation having a second wavelength,
   an insulator layer disposed adjacent to the first semiconductor region;
   a metal gate disposed adjacent to the insulator layer and opposite from the first semiconductor region for creating a potential well in the first semiconductor region; and
   the diode formed on the first semiconductor region opposite from the metal gate.

2. The detector of claim 1 wherein the first and second semiconductor regions comprise mercury, cadmium and tellerium.

3. The detector of claim 1 wherein the gate comprises nickel.

4. The detector of claim 1 wherein the diode formed by the first and second semiconductor regions, the insulator layer and the metal gate are aligned along an axis.

5. The detector of claim 1 further comprising a silicon processor for determining the respective charge in the first and second semiconductor regions.

6. A two color infrared detector comprising:
   a diode having first and second semiconductor regions, the regions comprising mercury, cadmium and tellerium, the first semiconductor region operable to generate electron-hole pairs when struck by infrared radiation having a first wavelength and the second semiconductor region operable to generate electron-hole pairs when struck by infrared radiation having a second wavelength, the regions aligned along an axis;
   an insulator gate adjacent the insulator layer opposite from the first semiconductor region for creating a potential well in the first semiconductor region.

7. The detector of claim 6 wherein the gate comprises nickel.

8. The detector of claim 6 further comprising a silicon processor fir determining the respective charge in the first and second semiconductor regions.

9. A method for simultaneously detecting two wavelengths of infrared radiation comprising the steps of:
   reverse biasing a diode having a first and a second semiconductor region, the first semiconductor region operable to generate electron-hole pairs when struck by infrared radiation having a first wavelength, the second semiconductor region operable to generate electron-hole pairs when struck by infrared radiation having a second wavelength;
   generating a potential well in the first region with a metal gate, the well operable to store a charge formed in the first region by the first wavelength of infrared radiation;
   sensing through the diode a charge formed in the second region by the second wavelength of infrared radiation;
   resetting the potential well; and
   sensing the charge formed in the first region through the diode.

10. The method of claim 9 wherein the step of reverse biasing further comprises the step of reverse biasing a diode comprising mercury, cadmium and tellerium.

11. A two color infrared detector comprising:
   a diode having first and second semiconductor regions, the first semiconductor region operable to generate electron-hole pairs when struck by infrared radiation having a first wavelength and the second semiconductor region operable to generate electron-hole pairs when struck by infrared radiation having a second wavelength;
   an insulator layer disposed on the first semiconductor region opposite from the second semiconductor region;
   a metal gate disposed on the insulator layer opposite from the first semiconductor region to form a metal insulator semiconductor; and
   an indium bump formed on the second semiconductor region opposite from the first semiconductor region for use in mating the diode with a silicon processor and for transmitting charges respectively from the first semiconductor region and the second semiconductor region to the signal processor.

12. The detector of claim 11 further comprising:
   a single connector supplying voltage ($V_A$) from a common voltage source to the metal gate; and
   the charge associated with electron-hole pairs generated in the first semiconductor region directed to the silicon processor through the diode and the indium bump.

13. The detector of claim 11 further comprising:
   a single connector for supplying first voltage ($V_A$) to the metal gate;
   another connector for supplying a second voltage ($V_B$) to the first semiconductor region; and
   the indium bump transmitting a third voltage ($V_C$) corresponding respectively to charges collected in the first semiconductor region and the second semiconductor region.

14. The detector of claim 11 wherein the diode is reversed bias with respect to the first semiconductor region.

* * * * *